United States Patent [19]

Kanegae

[11] 4,325,251

[45] Apr. 20, 1982

[54] APPARATUS FOR TESTING A CONTROL SYSTEM FOR AUTOMOTIVE VEHICLE

[75] Inventor: Hidetoshi Kanegae, Yokohama, Japan

[73] Assignee: Nissan Motor Company, Limited, Kanagawa, Japan

[21] Appl. No.: 162,091

[22] Filed: Jun. 23, 1980

[30] Foreign Application Priority Data

Jun. 28, 1979 [JP] Japan ................................. 54-80722

[51] Int. Cl.³ ........................................ G01M 15/00
[52] U.S. Cl. .................................. 73/119 A; 73/117.3
[58] Field of Search ............... 73/116, 117.3, 432 SD, 73/119 A; 364/551

[56] References Cited

U.S. PATENT DOCUMENTS 4,134,291  1/1979  Gregoire ..................... 73/432 SD
4,267,569  5/1981  Baumann et al. ................. 73/116 X

OTHER PUBLICATIONS

J25400 (Electronic Fuel Injection Analyzer); Instruction Manual.
EGI Control Unit Checker, EG 1135, Instruction Manual.

Primary Examiner—Jerry W. Myracle
Attorney, Agent, or Firm—Lowe, King, Price & Becker

[57] ABSTRACT

Actual signals from various sensors which sense the operational state of an internal combustion engine, or dummy signals from a dummy signal generator, are selectively supplied to a control unit. This unit calculates from the actual or dummy signals and outputs control signals which are then selectively supplied to actual loads, such as actuators, or dummy loads, thereby determining the control signals under respective conditions.

11 Claims, 5 Drawing Figures

APPARATUS FOR TESTING A CONTROL SYSTEM FOR AUTOMOTIVE VEHICLE

BACKGROUND OF THE INVENTION

1. Field of the Invention

The present invention relates to a system which controls various mechanisms, for an internal combustion engine, mounted on an automotive vehicle, and more particularly to apparatus for testing such a system.

2. Description of the Prior Art

Most conventional electronic control devices which control mechanisms, for an internal combustion engine, mounted on an automotive vehicle have been single function devices, such as, for example, an electronically controlled fuel injection device. In this prior art fuel injection device having only a single function, a means for testing the control device has been of a type which supplies predetermined dummy signals to the control device in order to obtain therefrom a control signal, e.g. the pulse duration for fuel injection, which is the determined and displayed.

Recently, a single control system has been put to practical use which includes a microcomputer and which effects a plurality of controls of fuel injection, spark advance angle, exhaust gas recirculation rate, etc. Such a control system includes relatively many sensors, actuators and considerably complicated wiring harnesses. Thus when a malfunction occurs in this control system, it takes considerable time and skill to find the malfunction. Further it is not easy to ascertain whether the system is operating completely. When a single control system is used in order to control several items in time sharing-mode, there are relatively many check items in a control unit itself to be used therein. Thus a testing apparatus is required which can test not only the control unit itself reliably and effectively but also the whole system except for the control unit.

SUMMARY OF THE INVENTION

The present invention provides a testing apparatus which can check not only the control unit itself effectively but also all other system elements including the sensors and actuators for their functions with the whole system being mounted on an automotive vehicle.

In one aspect of the present invention, actual signals from the sensor or dummy signals from a dummy signal generator are selectively supplied to a control unit which outputs control signals which are then selectively supplied to actual loads, such as actuators, or dummy loads thereby determining the control signals under respective conditions.

BRIEF DESCRIPTION OF THE DRAWINGS

Other features and advantages of the present invention will be apparent from the following description taken in conjunction with the drawings which are given by way of illustration only and not intended to be limitative. In the drawings.

DETAILED DESCRIPTION OF THE PREFERRED EMBODIMENT

Figure 1:
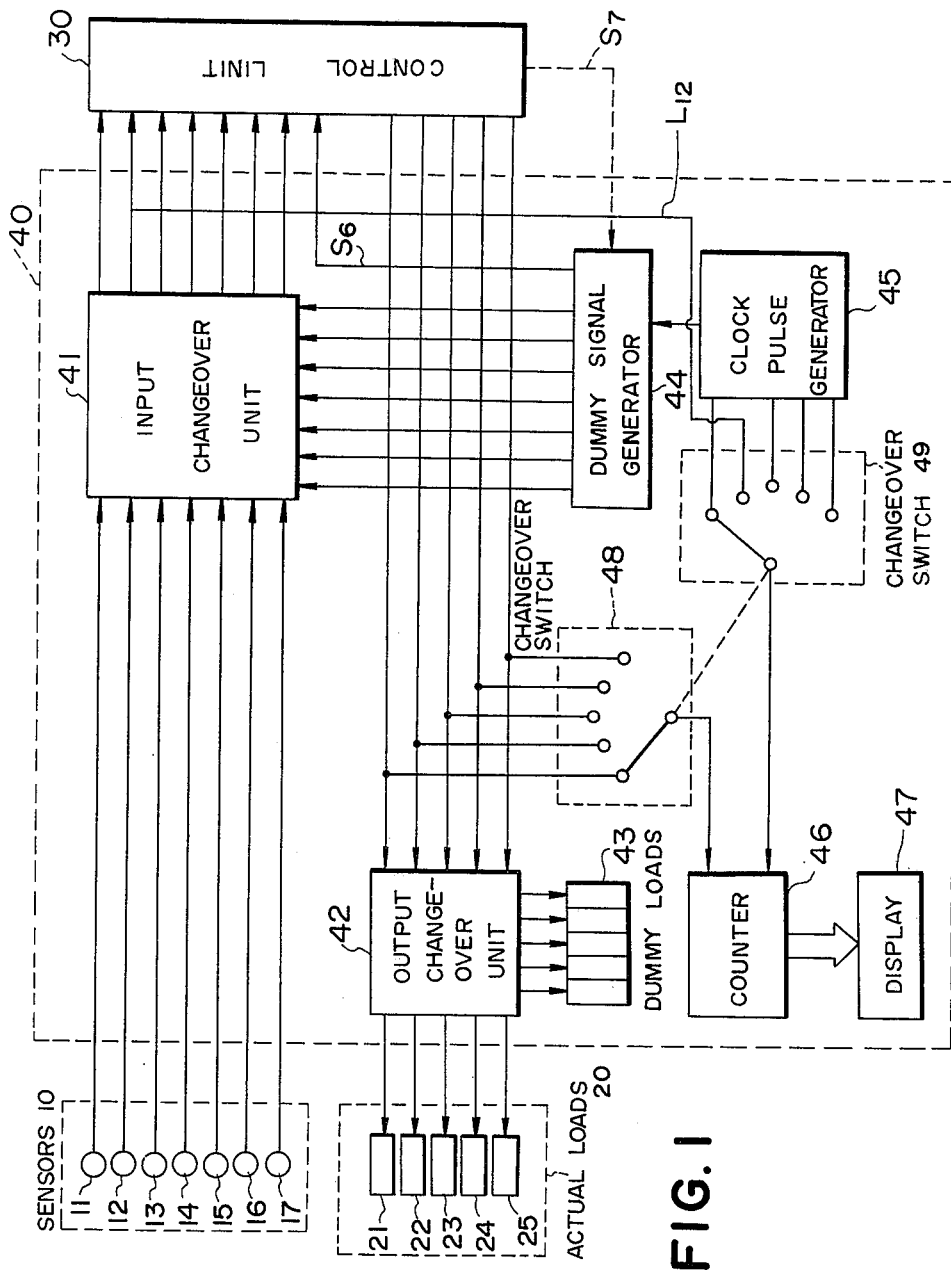
FIG. 1 is a block diagram of a system embodying the present invention.

FIG. 1 is a block diagram of a preferred embodiment of a testing apparatus 40 according to the present invention associated with a system which includes a plurality of sensors, including switches, generally designated by 10, mounted in an automotive vehicle. In the particular example illustrated, these sensors are an air flow meter 11 which senses an air flow drawn into the engine, a crank angle sensor 12 which senses the rotational angle or position of the crankshaft, a water temperature sensor 13 which senses the temperature of cooling water for the engine, a catalyst temperature sensor 14 which senses the temperature of a catalyst device, not shown, provided within the exhaust pipe, an oxygen sensor 15 which senses the partial pressure of oxygen in the exhaust gas to sense the ratio of air to fuel within the engine, a throttle switch 16 which senses whether a throttle valve, not shown, for the engine is completely closed, and a neutral switch 17 which senses the neutral position of a transmission, not shown. When the engine is operating normally, the signals from these sensors are input directly to a control unit 30 which is constituted by an electronic circuit which may includes a well known microcomputer, analog circuits, or the like. The control unit 30 performs predetermined operations on the signals from the sensors as parameters and outputs control signals which drive a plurality of actuators, generally designated by 20, in order to maintain the engine in the optimal state. These actuators are, in this case, an ignition device 21 which ignites an air/fuel mixture fed to the engine, a fuel injection valve 22 which injects fuel into the intake pipe, not shown, before being fed into the engine, an EGR control valve 23 which controls the exhaust gas recirculation ratio, an idle control valve 24 which opens and closes a passage, not shown, bypassing the throttle valve to control the rotational speed of the engine during idling, and a fuel pump 25 which pressurizes fuel upstream of the fuel injection valve 22.

The testing apparatus 40 is connected through connectors, not shown, between the sensors 10, the actuators 20, and the control unit 30. The apparatus 40 includes an input changeover unit 41, an output changeover unit 42, a plurality of dummy loads 43, a counter 46, a display 47, and changeover switches 48 and 49. The input changeover unit 41 is a switch which selectively connects either the actual signals from the sensor 10 or the dummy signals from the dummy signal generator 44 to the input lines to the control device 30. The output changeover unit 42 is a switch which selectively connects the output lines from the control unit 30 to either the actual actuators 20 or to the dummy loads 43. This changeover unit 42 allows the individual actuators to be switched independently of each other. Each of the dummy loads 43 has substantially the same electrical characteristics as the corresponding actual actuator. The clock pulse generator 45 generates different clock frequencies depending on the item to be determined and displayed. The counter 46 and the display 47 displays the pulse duration of control signals from the control unit 30, selected by changeover switches 48 and 49 in unison to select a control signal to be checked and a corresponding clock frequency or crank angle signal fed from the crank angle signal 12 through the input changeover unit and a line $L_{12}$, and appearing at a terminal of the switch 49. While the control signal is fed as a gating signal through the changeover switch 48 to the counter 46, the pulses fed through the changeover switch 49 are counted so as to display the pulse duration of the control signal. Such a structure gives a plurality of testing functions to the apparatus. That is, the input changeover unit 41 is switched so as to input a plurality of dummy signals, which may be of different frequencies, from the dummy signal generator 44 to the control unit 30. This unit calculates according to these inputs, and produces respective control signals, corresponding to the results of calculation, which drive the loads connected to the output lines of the control unit 30. In this case, the user can select either the actual loads, i.e. actuators 20, mounted in the vehicle or the dummy loads 43 in the apparatus 40 as the load driven, using the changeover unit 42. One of a plurality of control signals from the control unit 30 is selected by the changeover switch 48, and the pulse duration of the selected signal is displayed by the display 47 after counting by the counter 46. The correctness of the displayed value compared with the dummy signal can be determined by whether the control unit 30 operates properly. Changing over of the dummy loads to the actual loads (actuators 20) allows malfunctions in the actuators to be tested. Comparison between the displayed values for the actual and dummy loads indicates possible faults in the wiring to the actuators. Any number of actual and dummy signals, and actual and dummy loads can be used, as required. However, when the control unit 30 or the actuators 20 are checked using the dummy signals, the engine itself should be stopped. Thus the output changeover unit 42 includes means, not shown, which prevents connection between the fuel injection valve 22 and the fuel pump 25 (i.e. the actual load) when the input to the control unit 30 is a dummy signal, thereby preventing spurious supply of fuel to the engine, i.e. the manifold or cylinders thereof during the test, and thereby avoiding difficulty in starting the engine afterwards. As described above, the counter 46 and the display 47 determine the pulse duration, and the changeover switch 48 selects one of the output lines from the control unit 30 in order to apply a gating input to the counter 46. Simultaneously, the changeover switch 49 selects a clock frequency, or a crank angle signal, from the clock pulse generator 45, corresponding to the signal to be displayed, in order to input it to the counter 46. In more detail, one of the combinations of gating and clock pulse signals, shown in Table 1, is selected. The respective combinations will be described hereinafter.

TABLE 1

| CONTROL | GATING SIGNAL TO COUNTER | CLOCK PULSE SIGNAL |
|---|---|---|
| SPARK ADVANCE ANGLE | FROM WHEN IGNITION COIL CURRENT IS TURNED OFF UNTIL REFERENCE POSITION PULSE $S_1$ IS INPUT | ANGLE PULSE $S_5$ |
| DWELL ANGLE OR TIME | ON SIGNAL FOR IGNITION COIL | ANGLE PULSE OR 10 $\mu s$ PULSE |
| FUEL INJECTION | ON SIGNAL FOR FUEL INJECTION VALVE | 10 $\mu s$ PULSE |
| EGR CONTROL | ON SIGNAL FOR EGR CONTROL VALVE (PULSE SIGNAL OF 51.2 ms PERIOD) | 51.2 $\mu s$ PULSE |
| IDLE CONTROL | ON SIGNAL FOR IDLE CONTROL VALVE (PULSE SIGNAL OF 51.2 ms PERIOD) | 51.2 $\mu s$ PULSE |

Figure 2:
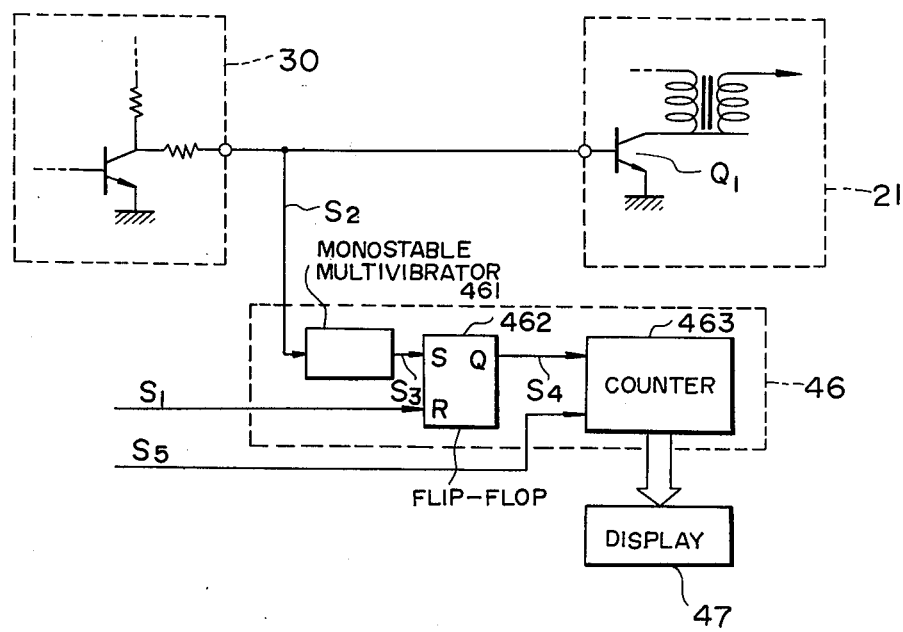
FIG. 2 is a diagram of a circuit to determine a spark advance angle.
Figure 3:
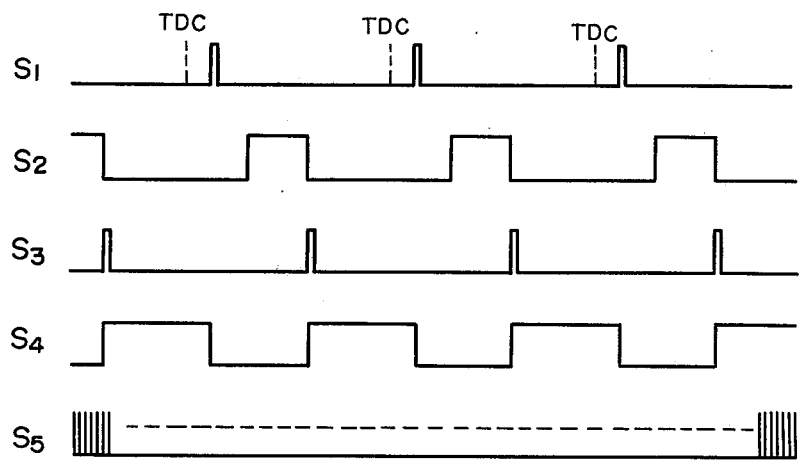
FIG. 3 is a timing chart of the circuit of FIG. 2.

First, referring to FIGS. 2 and 3, the determination of a spark advance angle will be illustrated.

First, referring to FIG. 2, a circuit for determining a spark advance angle is shown. The same reference numerals denote corresponding elements in FIGS. 1 and 2. For the purpose of brevity, the input and output changeover units 41 and 42, and the changeover switches 48 and 49 are omitted. Symbols $S_1$ to $S_5$ in FIG. 3 denote signal waveforms produced from the points denoted by the corresponding symbols in FIG. 2.

When the spark advance angle is determined, a reference position pulse $S_1$ and an angle pulse $S_5$ are used both of which are produced from the crank angle sensor 12, as shown in Table 1.

The crank angle sensor 12 is attached to the crankshaft of the engine, and produces two kinds of signals, one being referred to as the reference position pulse which is produced a fixed rotational crankshaft angle from the top dead center (TDC) of each engine cylinder, and the other being referred to as the angle pulse which is produced for each crank angle rotation of 1°. When the dummy signal is to be used, signals, equivalent to the just-mentioned actual signals, are produced from the dummy signal generator 44 and input to the control unit 30. These signals are also used for determining the spark advance angle. The spark signal can be taken from the primary side of the ignition coil. However, the problem is that the primary side of the ignition coil is normally at high voltage level, and contains a considerable amount of noise components, and that extra wiring connections are needed for determination. Thus the base voltage of a spark power transistor $Q_1$ is extracted as an on-off signal $S_2$ for the ignition coil. A change in this base signal $S_2$ from high to low, i.e. a spark timing, actuates a monostable multivibrator 461 whose output $S_3$ sets a flip-flop 462 which is reset by a reference position pulse $S_1$ from the crank angle sensor 12. When the counter 463 counts angle pulses $S_5$ from the crank angle sensor as a clock pulse signal for the time interval when the output $S_4$ from the flip-flop 462, used as a gating signal, is high, and the counted value is displayed by the display 47, the displayed value shows the angle from the spark timing to the reference position pulse, i.e. the value of the spark advance angle before top dead center (BTDC) plus a fixed angle.

Next, determination of the dwell angle or dwell time will be described. To this end, the high level of the base signal, mentioned above, is used as a gating signal, and a pulse signal having a period of 10 $\mu s$, or an angle pulse signal from the crank angle sensor is used as a clock pulse signal. The duty factor of a current flowing through the ignition coil is generally controlled using an electronic circuit so that the time interval for which electric current is supplied is constant. Thus it is advantageous to effect determination in time units, using pulses of 10 $\mu s$ period. Alternatively, if the angle pulses are used as a clock pulse signal, determination in angle units is also possible.

As for determination of fuel injection, the ON signal for the fuel injection valve is used as a gating signal, whereas 10 μs period clock pulse signal is used to determine the time interval of opening the injection valve.

Determination of the EGR control and the idle control are now described together, since the principle of operation is the same in each case.

A pulse signal of for example 51.2 ms period is used as a control signal for the EGR control valve and the idle control valve by changing the duty factor of the signal. Consequently, the duty factor should preferably be displayed directly. To this end, a pulse signal having a 51.2 μs period is used as a clock pulse signal, and the ON signal for the EGR control valve and the idle control vale is used as a gating signal. In this case, a clock signal should preferably be used which is a power of 10 multiplied by the frequency of the control signal. Thus counting of clock pulses while the gating signal is high or low allows visual reading of the duty factor in percent down to one place of decimals. This function of displaying the output value operates in the same way as described above even when the input changeover unit 41 is connected to the sensors 10, and therefore it is possible to determine the spark advance angle, fuel injection, EGR, etc., while actually operating the engine, which is very advantageous in testing malfunctions of the engine.

It is also necessary to supply reference position pulses and angle pulses from the crank angle sensor to the counter 46 when the spark advance angle and the dwell angle or time are determined.

Table 2 shows the items which can be tested according to switching between the actual loads and signals, and the dummy loads and signals.

TABLE 2

| OUTPUT | INPUT | |
|---|---|---|
| | ACTUAL SENSOR SIGNALS | DUMMY SIGNALS |
| ACTUATORS (ACTUAL LOADS) | 1. MONITORING DURING OPERATION<br>2. TESTING ACTUATORS<br>3. TESTING SENSORS | 1. SELF TEST OF CONTROL CIRCUIT<br>2. TESTING ACTUATORS<br>3. TESTING SENSORS<br>4. CHECKING OUTPUT WIRING |
| DUMMY LOADS | 1. TESTING DEVICE OPERATION DURING STARTER MOTOR OPERATION | 1. TESTING ACTUATORS<br>2. SELF TEST OF CONTROL CIRCUIT |

The apparatus according to the present invention may also have another testing function which will be now described.

If the control unit 30 is constituted by a microcomputer, a self test or check of the computer is possible by storing a self test program which is run under predetermined running conditions. Then if dummy signals corresponding to the predetermined running conditions are applied to the computer, the self test can easily be carried out.

TABLE 3

| SELF TEST PROGRAM | PROGRAM RUNNING CONDITIONS |
|---|---|
| RAM CHECK | CHECK FLAG = 1,<br>NEUTRAL SWITCH = ON,<br>THROTTLE SWITCH = OFF,<br>ROTATIONAL SPEED ≧ 3,200 rpm |
| ROM CHECK | CHECK FLAG = 1,<br>NEUTRAL SWITCH = ON,<br>THROTTLE SWITCH = OFF |
| INPUT SELF CHECK I | CHECK FLAG = 1,<br>NEUTRAL SWITCH = OFF,<br>THROTTLE SWITCH = OFF |
| INPUT SELF CHECK II | CHECK FLAG = 1,<br>THROTTLE SWITCH = OFF,<br>ROTATIONAL SPEED < 3,200 rpm |

In Table 3, the functions and running conditions for an example set of self test programs are shown, where RAM is a read and write memory for the microcomputer, and ROM is a read only memory. In the table, "THROTTLE SWITCH =OFF" denotes that the throttle valve is not in the completely closed position, and "NEUTRAL SWITCH=ON" denotes that the transmission is in the neutral position.

As shown in Table 3, the various self check or test programs are run when the neutral switch, the throttle switch and the rotational speed of the engine are in the corresponding predetermined conditions. The check flag is set to 1 when a clock pulse $S_6$ (further described below) is input to a special self check input terminal of the control unit 30. The results of a self check produced by these programs are sent to the testing apparatus 40, using the output $S_7$ which may be, for example, the output of a catalyst temperature alarm lamp.

Figure 4:
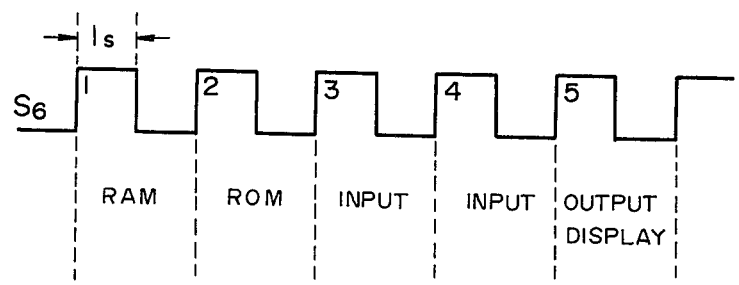
FIG. 4 is a sequence chart for self checking.
Figure 5:
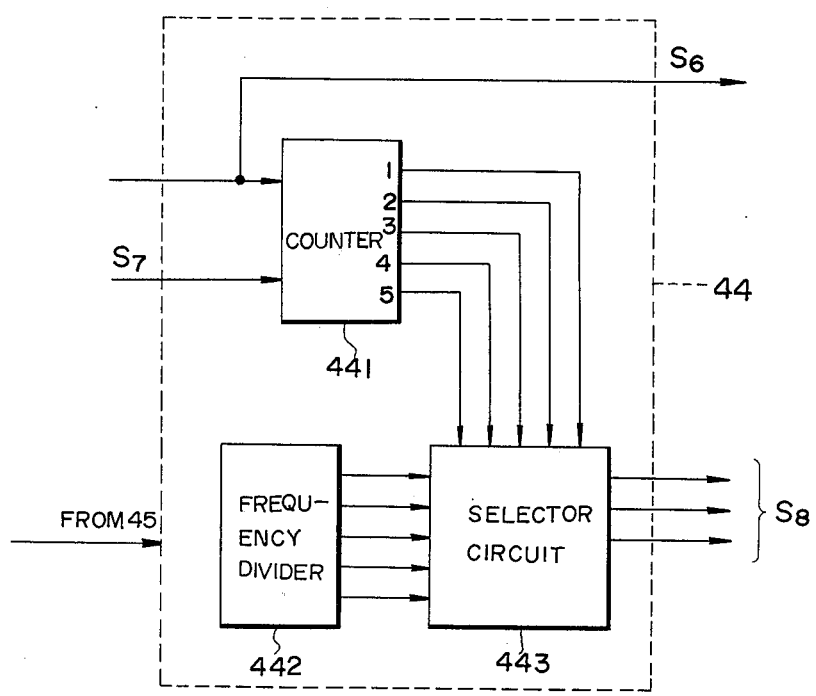
FIG. 5 is a block diagram of a circuit to generate a dummy signal.

In order to use such a self test function effectively, the testing apparatus 40 is operated according to a given sequence which is advanced by a reference clock pulse signal $S_6$ generated from the dummy signal generator 45. FIG. 4 shows the sequence of the operation. FIG. 5 illustrates the structure of the dummy signal generator 44. The dummy signal generator 44 includes a frequency divider 442 which receives one output frequency of the clock pulse generator 45 and which may output a plurality of pulse signals of different frequencies lower than the output frequency. The reference clock pulse signal $S_6$ from the divider 442 is input to the special self check input terminal of the control unit 30 in order to set the check flag to 1, and simultaneously, to the counter 441 as a clock pulse signal. The counter 441 counts pulses of this signal and as a result, the outputs 1 to 5 thereof go high in turn. A selector unit 443 outputs a plurality of signals, generally designated by $S_8$, corresponding to the conditions of Table 3 from the output signals of the frequency divider 442 according to the output of the counter 441. The selected signals $S_6$ are sent through the input changeover unit 41 to the control unit 30 to run the self check or test programs sequentially according to the sequence such as shown in FIG. 4. The results of self test are output as the catalyst temperature alarm output $S_7$, as mentioned above. If they are NG (no good), the output will be high, thereby stopping the counting of the counter 441 and therefore the sequence, and causing a lamp to display the NG state.

According to the present invention, malfunctions in sensors and actuators, and checking of output wiring for breaks in circuit, and the operation of the control unit are properly checked, including monitoring of relatively complicated systems in an easy manner.

Also, when the control unit is constituted by a microcomputer, a self check may be carried out efficiently in a relatively short time because signals suitable for indicating running conditions of the self check program are easily produced from dummy signals.

Since the displayed results obtained from the determination directly show the actual physical values, assessment of the results is easily made.

Since it is arranged so that the fuel injection valve and the fuel pump are not simultaneously supplied with respective driving signals while the test is being effected using dummy signals (while the engine is at rest), fuel is not supplied to the engine at rest, and thus there is no problem of making the starting of the engine difficult due to flooding of the engine with fuel.

There has been provided a testing device according to the present invention that satisfies all of the aims and objectives set forth hereinabove. It should be understood that further modifications and variations may be made in the present invention without departing from the spirit of the present invention as set forth in the appended claims.

What is claimed is:

1. An apparatus for testing a system which controls various devices mounted on an automotive vehicle, said system including a plurality of sensors for sensing various operational conditions of the automotive vehicle to output signals representing the operational conditions, a control unit responsive to the signals from said plurality of sensors to output various control signals, and a plurality of actuators responsive to the control signals to control corresponding devices, said apparatus comprising:
   a dummy signal generator for producing a plurality of dummy signals corresponding to the signals from said plurality of sensors;
   a plurality of dummy loads substantially electrically equivalent to said plurality of actuators;
   an input changeover means for selectively connecting each of either the signals from said sensors or the dummy signals to said control unit;
   an output changeover means for selectively connecting each of either said plurality of actuators or said dummy loads to said control unit; and
   means for measuring the control signals from said control unit.

2. The apparatus according to claim 1, wherein said measuring means includes a clock pulse generator for generating a plurality of different clock frequency signals, a counter, a first switching means for selectively connecting each of the control signals from said control unit to said counter as a gating signal thereto, a second switching means for selectively connecting each of either the plurality of different clock frequency signals and the output of a crank angle sensor to said counter as a signal to be counted, corresponding to a control signal to be selectively connected.

3. The apparatus according to claim 1, wherein said measuring means includes a clock pulse generator, and wherein said dummy signal generator includes a frequency divider for dividing the clock pulse signal from said clock pulse generator into a plurality of different frequency signals, a controlling means responsive to a reference clock pulse signal for generating a plurality of outputs which change in turn, and a selector means responsive to the outputs of the controlling means and the frequency divider means for producing a plurality of dummy signals.

4. The apparatus according to claim 1, 2 or 3, wherein said measuring means includes means for displaying each of the measured values of the control signals in numerical units appropriate to each of the control signals.

5. The apparatus according to claim 4, wherein said measuring means includes means for displaying the pulse duration in time of a signal which controls a fuel injection valve when a control signal for fuel injection is measured.

6. The apparatus according to claim 4, wherein said measuring means includes means for displaying the crank angle from a spark position to a reference position when a control signal for an ignition device is measured.

7. The apparatus according to claim 4, wherein said measuring means includes means for displaying the time duration for which an ignition coil is supplied with electric current when a control signal for an ignition device is measured.

8. The apparatus according to claim 4, wherein said measuring means includes means for displaying a crank angle for which an ignition coil is supplied with electric current when a control signal for an ignition coil is measured.

9. The apparatus according to claim 4, wherein said measuring means includes means for displaying a duty factor of a signal controlling an actuator in units of cycles of a clock signal whose frequency is a power of 10 multiplied by the frequency of said controlling signal.

10. The apparatus according to claim 4, wherein said output changeover means is arranged such that control outputs to a fuel injection valve and a fuel pump are disconnected when said input changeover means connects dummy signals to said control unit.

11. The apparatus according to claim 4, wherein said control unit includes a computer which starts a program stored therein for self check when predetermined input conditions to said control unit hold, whereby a plurality of predetermined dummy signals are supplied to said control unit to execute in a predetermined sequence said self check program.

* * * * *